United States Patent
Wilson et al.

(10) Patent No.: US 9,608,571 B2
(45) Date of Patent: Mar. 28, 2017

(54) HIGH EFFICIENCY VARIABLE VOLTAGE SUPPLY

(71) Applicant: SNAPTRACK, INC., San Diego, CA (US)

(72) Inventors: Martin Wilson, Cambourne (GB); Shane Flint, Cambourne (GB)

(73) Assignee: SNAPTRACK, INC., San Diego, CA (US)

( * ) Notice: Subject to any disclaimer, the term of this patent is extended or adjusted under 35 U.S.C. 154(b) by 0 days.

(21) Appl. No.: 15/170,217

(22) Filed: Jun. 1, 2016

(65) Prior Publication Data

US 2016/0285424 A1    Sep. 29, 2016

Related U.S. Application Data

(63) Continuation of application No. 14/223,494, filed on Mar. 24, 2014, now Pat. No. 9,379,631, which is a
(Continued)

(30) Foreign Application Priority Data

Aug. 25, 2004 (GB) .................................. 0418991.6

(51) Int. Cl.
    *H01L 29/49* (2006.01)
    *H03F 1/02* (2006.01)
    (Continued)

(52) U.S. Cl.
    CPC ............ *H03F 1/0233* (2013.01); *H02M 5/02* (2013.01); *H03F 1/0211* (2013.01); *H03F 3/19* (2013.01);
    (Continued)

(58) Field of Classification Search
    CPC ........ H03F 1/0233; H03F 1/0211; H03F 3/19; H02M 5/02
    See application file for complete search history.

(56) References Cited

U.S. PATENT DOCUMENTS

| | | | |
|---|---|---|---|
| 5,905,407 A | 5/1999 | Midya | |
| 5,942,938 A | 8/1999 | Myers et al. | |

(Continued)

FOREIGN PATENT DOCUMENTS

| | | |
|---|---|---|
| WO | WO-03056698 A2 | 7/2003 |
| WO | WO-2004015855 A1 | 2/2004 |
| WO | WO-2004075398 | 9/2004 |

OTHER PUBLICATIONS

Giulio Fedi, "European Examination Report for Application No. 05 775 234.7-1233", Jul. 10, 2007, Publisher: European Patent Office, Published in: DE.

(Continued)

*Primary Examiner* — Michael Shingleton
(74) *Attorney, Agent, or Firm* — Patterson & Sheridan, L.L.P.

(57) ABSTRACT

Aspects of the present disclosure are generally directed to a power supply for generating an output supply voltage. The power supply generally includes a variable voltage supply configured to generate an intermediate supply voltage based on a reference signal, a correction circuit configured to generate an error signal based on the output supply voltage or the intermediate supply voltage, and a combiner configured to combine the intermediate supply voltage and the error signal to provide the output supply voltage.

23 Claims, 3 Drawing Sheets

Related U.S. Application Data continuation of application No. 13/169,771, filed on Jun. 27, 2011, now Pat. No. 8,680,916, which is a continuation of application No. 11/574,218, filed as application No. PCT/GB2005/003318 on Aug. 25, 2005.

(51) Int. Cl.
*H02M 5/02* (2006.01)
*H03F 3/19* (2006.01)

(52) U.S. Cl.
CPC .. *H03F 2200/102* (2013.01); *H03F 2200/204* (2013.01); *H03F 2200/451* (2013.01); *H03F 2200/504* (2013.01)

(56) References Cited

U.S. PATENT DOCUMENTS

| | | | |
|---|---|---|---|
| 6,141,541 A | 10/2000 | Midya et al. | |
| 6,157,253 A | 12/2000 | Sigmon et al. | |
| 6,175,273 B1 | 1/2001 | Sigmon et al. | |
| 6,373,340 B1 | 4/2002 | Shashoua | |
| 6,605,999 B2 * | 8/2003 | Matsushita | H03F 1/0233 330/133 |
| 7,023,190 B2 | 4/2006 | Chapuis | |
| 7,071,781 B2 * | 7/2006 | Everton | H03F 1/0233 330/260 |
| 7,482,869 B2 | 1/2009 | Wilson | |
| 8,680,916 B2 | 3/2014 | Wilson et al. | |
| 2003/0137286 A1 | 7/2003 | Kimball et al. | |
| 2004/0100323 A1 | 5/2004 | Khanifar et al. | |
| 2005/0122162 A1 | 6/2005 | Ishizaki | |
| 2007/0210771 A1 | 9/2007 | Wilson et al. | |
| 2009/0261908 A1 | 10/2009 | Markowski | |
| 2014/0203789 A1 | 7/2014 | Wilson et al. | |

OTHER PUBLICATIONS

"Related EP Patent Application No. 05 775 234.7 Examination Report", Jul. 17, 2013, Publisher: EPO, Published in: EP.

* cited by examiner

HIGH EFFICIENCY VARIABLE VOLTAGE SUPPLY

CROSS-REFERENCE TO RELATED APPLICATIONS

The present application is a Continuation of U.S. patent application Ser. No. 14/223,494 with a U.S. filing date of Mar. 24, 2014, which is a Continuation of U.S. patent application Ser. No. 13/169,771 with a U.S. filing date of Jun. 27, 2011, which is a Continuation of U.S. patent application Ser. No. 11/574,218, with a U.S. filing date of Aug. 2, 2007, which is a 371 filing of PCT/GB2005/003318, filed on Aug. 25, 2005 which in turn claims priority to British Application Number 0418991.6, filed on Aug. 25, 2004, all of which are assigned to the assignee of the present application and hereby expressly incorporated by reference herein in their entireties.

BACKGROUND

Field of the Invention

The present invention relates to control of a supply voltage level, in an arrangement in which the supply voltage is variable to track a reference level, which reference level may represent a signal to be amplified.

Background of the Invention

Modern communications systems often employ linear modulation schemes that exhibit high peak to average power ratios to achieve high capacity. Signals subjected to such modulation have a wide dynamic range, infrequently achieve peak levels, and frequently operate below peak levels. To provide linear amplification for signals subjected to such modulation, traditional radio frequency (RF) amplifier architectures need to be significantly backed-off. This generally results in poor efficiency.

A number of techniques exist to improve efficiency based on supply voltage. Notable amongst these supply voltage based efficiency enhancement schemes are those of envelope tracking and envelope elimination and restoration.

These two techniques improve efficiency by dynamically adjusting or tracking the supply to the amplifier device in harmony with the envelope of the modulation signal to be amplified. When applied to an amplifier stage, the dynamic adjustment of the supply alters the drain supply or bias of the amplifier. This results in high final stage efficiencies.

At least three problems exist in implementing such dynamic supply adjustment techniques. Firstly the need to modulate the supply may require tracking bandwidths of three to four times the modulation bandwidth of the signal to be amplified, which must be generated efficiently. Secondly, any noise or distortion in the supply to the amplifier will be modulated up to the carrier frequency resulting in unacceptable out-of-band spectral emissions. Finally, the supply typically requires a high output voltage dynamic range and is typically required to deliver a high peak to average power ratio.

As a result a supply voltage modulation source not only needs to be efficient, but must also have a tracking response which is substantially accurate; has a high slew rate and peak power; and produces distortion that is either small or bandwidth constrained and predictable.

When applied to high power broadband systems such as multi-carrier WCDMA (wideband code division multiple access), prior art attempts to address this problem using either Class-S modulators (pulse width modulation) or Class-G modulators (switched supply) exhibit unacceptable performance due to insufficient tracking bandwidth, excessive switching losses, or unacceptable distortion characteristics.

It is an aim of the invention to provide an improved technique which addresses one or more of the above-stated problems. In particular it is an aim of the invention to provide an improved supply architecture, which offers improved or optimised efficiency.

SUMMARY OF THE INVENTION

In accordance with a first aspect of the invention there is provided a power supply stage, comprising: selection means for selecting a power supply voltage from a high efficiency variable voltage supply in dependence on a reference signal; adjusting means for receiving the selected power supply voltage, and adapted to generate an adjusted selected power supply voltage tracking the reference signal in dependence thereon.

Further in accordance with the first aspect of the invention there is provided a power supply stage, comprising: generating means for generating a power supply voltage from a high efficiency variable voltage supply in dependence on a reference signal; adjusting means for receiving the generated power supply voltage, and adapted to provide an adjusted generated power supply voltage tracking the reference signal in dependence thereon.

The generating means may select a power supply voltage from a plurality of discrete levels of voltage supply. The generating means may be a selection means. The generating means may provide a power supply voltage based on an approximate continuous selection.

The output efficiency of the high efficiency variable voltage supply may be greater than 0.7.

The power supply stage may further comprise a lower efficiency supply for supplying the adjusting means. The output efficiency of the adjusting means may be greater than 0.4.

The reference signal may comprise an input waveform representing a desired supply voltage level. The high efficiency variable voltage supply may generate an intermediate supply voltage level.

The adjusting means may include a correction element for generating an error level representing an error between a desired voltage supply level and an output supply voltage level.

The power supply stage may be adapted to maximise the efficiency of the high efficiency variable voltage supply, whilst maintaining a low peak-to-average ratio for the error level. The power supply stage may be adapted to maximise the efficiency of the high efficiency variable voltage supply, whilst maintaining a low slew rate for the error level. A ratio of peak error signal to peak output signal is preferably maintained at less than 0.5. A ratio for peak error signal slew rate to peak output signal slew rate is preferably less than 1.5.

The error level may be generated in dependence on the supply voltage level fed back from an output of the supply voltage stage.

The error level may be a voltage level, an energy level, or a power level.

The error level may be generated in dependence on a prediction of the supply voltage level at an output of the supply voltage stage. The prediction of the supply voltage level may be at least partly determined in dependence on the intermediate supply voltage level.

The adjusting means may include a combiner for combining the error level with an intermediate supply voltage level to generate the output supply voltage level. The intermediate supply voltage level may be adjusted by adding or removing voltage or energy.

The combiner may be adapted to sink energy, source energy, or sink energy and source energy, in dependence on the error level. The combiner may be adapted to sink energy from, source energy to, or sink energy from and source energy to, the output of the high efficiency variable voltage supply.

The adjusting means may be configured to source energy to allow adjustment of the output supply voltage level above the intermediate supply voltage level. The adjusting means may be configured to sink energy to allow adjustment of the output supply voltage level below the intermediate supply voltage level. The adjusting means may be configured to source and sink energy to allow adjustment of the output supply voltage level above and below the intermediate supply voltage level.

The intermediate supply power may be greater than an error power. The ratio of the error power to the intermediate supply power may be much less than 1. The ratio of the error power to the intermediate supply power may be less than 0.4.

The power associated with the signal providing the intermediate supply voltage level may be greater than the power associated with the signal providing the error level.

The correction element may be configured to receive a continuous supply modulation. The correction element may be configured to receive a supply switched between pluralities of supplies. The switched supply may be a Class-G or Class-H supply.

The high efficiency variable voltage supply may be optimised for efficiency at the expense of accuracy. The high efficiency variable voltage supply may be further optimised for transient response at the expense of accuracy.

The correction element of the adjusting means may be optimised to provide accurate error tracking. The correction element of the adjusting means may be further optimised to deliver high peak to mean output power with good efficiency. The correction element of the adjusting means may be a linear Class-G amplifier having multiple power supplies. The correction element of the adjusting means may be a linear Class-H amplifier having multiple power supplies.

There may be further provided a feedback from the high efficiency variable voltage supply to the selection means. There may be further provided a feedback from an output of the power supply stage to the selection means.

The selection means may include tracking means.

In a second aspect the invention provides a power supply stage having an output supply voltage level, comprising: a variable voltage supply, adapted to generate an intermediate supply voltage level in dependence on an input waveform representing a desired output supply voltage level; a correction element, adapted to generate an error level representing an error between the actual output supply voltage level the desired supply voltage level; and a combiner for combining the error level and the intermediate supply voltage level to provide the output voltage supply level.

The variable voltage supply may include a high efficiency supply stage and the correction element includes a lower efficiency supply stage.

The variable voltage supply may include a supply stage for generating an output signal having efficiency greater than 0.7, and the correction element includes a supply stage for generating an output signal having efficiency greater than 0.4.

The output signal of the correction element may have a lower efficiency than an output signal of the supply stage.

The intermediate supply voltage signal may be associated with an intermediate power level and the error level signal may be associated with an error power level, the intermediate power level being much greater than the error power level.

The ratio of the error level to the intermediate supply voltage level may be less than 0.4. The output of the stage may have an efficiency of greater than 0.7. The ratios may be power or voltage ratios.

The efficiency of the variable voltage supply may be maximised, whilst jointly minimising the peak-to-average ratio of the error level and the slew rate of the error level. A ratio of peak error signal to peak output signal may be maintained at less than 0.7, and a ratio for peak error signal slew rate to peak output signal slew rate may be maintained at less than 1.5.

The output of the stage may provide a power supply to a radio frequency amplifier.

In an aspect the invention provides a method of controlling a power supply stage, comprising: selecting a power supply voltage from a high efficiency variable voltage supply in dependence on a reference signal; receiving the selected power supply voltage, and adjusting the selected power supply voltage by tracking the reference signal in dependence thereon.

The output efficiency of the high efficiency variable voltage supply may be maintained as greater than 0.7.

The method may further comprise providing a lower efficiency supply for supplying the adjusting means. The output efficiency of the adjusting means may be maintained as greater than 0.4.

The method may further comprise providing, as the reference signal, an input waveform representing a desired supply voltage level.

The method may further comprise generating an intermediate supply voltage level.

The method may comprise generating an error level representing an error between a desired voltage supply level and an output supply voltage level.

The method may further comprise combining the error level with the intermediate supply voltage level to generate the output supply voltage level.

The intermediate supply power may be maintained greater than error power.

The method may comprise maintaining the ratio of the error power to the intermediate supply power as much less than 1.

The ratio of the error power to the intermediate supply power may be maintained as less than 0.4.

The method may further comprise maintaining the power associated with the signal providing the intermediate supply voltage level as greater than the power associated with the signal providing the error level.

The method may further comprise minimising the peak amplitude of the error level. The method may further comprise maintaining a ratio of peak error level to peak output level of less than 1. The ratio of the peak error level to peak output level may be maintained at less than 0.7.

The method may further comprise minimising the slew rate of the error level. The ratio of the peak slew rate of error level to the peak slew rate of the output level may be maintained as less than 1.5.

In another aspect there is provided a method of controlling a power supply stage having an output supply voltage level, comprising: generating an intermediate supply voltage level in dependence on an input waveform representing a desired output supply voltage level; generating an error level representing an error between an actual output supply voltage level the desired supply voltage level; and combining the error level and the intermediate supply voltage level to provide the output voltage supply level.

The invention may be considered to consist of a high efficiency, high accuracy, tracking supply comprising one or more of the following elements or functionalities: a high efficiency variable output supply having the ability to track significant transients of the input (reference) waveform with coarse accuracy, distortion or limited response; an active correction element to remove any error between the variable supply output and desired output; a tracking control element to stimulate the high efficiency supply and supply correction elements in response to the reference waveform; such feedback and control loops as required to ensure that the resulting supply provides a faithful representation of the reference waveform.

According to embodiments of the invention there is provided a power supply stage, comprising: reference means for providing a reference signal representing a desired power supply voltage; election means for selecting an approximate power supply voltage in dependence on the reference signal; adjusting means for receiving the selected power supply voltage and the reference signal and adapted to generate an adjusted selected power supply voltage tracking the reference signal in dependence thereon.

The power supply stage may be for an amplifier, the reference signal representing the envelope of an input signal of said amplifier. The adjusting means may include linear amplifier. The selected power supply voltage may have the minimum absolute difference between said power supply voltage and the reference signal level.

The linear amplifier may be connected to amplify the difference between the reference signal and a representation of the selected power supply voltage. The adjusting means may include means for summing the amplified difference with the selected supply voltage.

The representation of the selected power supply voltage may be the power supply voltage itself. The representation of the selected power supply voltage may be the adjusted selected power supply voltage. The adjusted selected supply voltage may be the output of the power supply stage.

The adjusting means may comprise a plurality of cascaded correction circuits. The adjusting means may comprise two or more cascaded correction circuits.

According to embodiments of the invention the present invention provides a radio frequency amplification stage comprising: an amplifier for receiving an input signal to be amplified and a power supply voltage; and a power supply voltage stage for supplying said power supply voltage, comprising: means for providing a reference signal representing the envelope of the input signal; means for selecting an approximate voltage level in dependence on the reference signal; and means for generating an adjusted selected power supply voltage, comprising a linear amplifier for amplifying a difference between the reference signal and one of the selected supply voltage level or the adjusted selected supply voltage level, and a summer for summing the amplified difference with the selected supply voltage to thereby generate the adjusted supply voltage.

The means for generating an adjusted selected supply voltage may further generate a further adjusted supply voltage and further comprises an RF amplifier for amplifying a difference between the reference signal and one of the adjusted supply voltage or the further adjusted supply voltage, and a summer for summing such amplified difference with the adjusted supply voltage to thereby generate the further adjusted supply voltage.

One of the adjusted supply voltage or further adjusted supply voltage may form the supply voltage to the amplifier.

According to embodiments of the invention the present invention provides a method of controlling a power supply stage, comprising: providing a reference signal representing a desired power supply voltage; selecting an approximate power supply voltage in dependence on the reference signal; generating an adjusted selected power supply voltage tracking the reference signal in dependence on the selected power supply voltage and the reference signal.

The reference signal may represent the envelope of an input signal to an amplifier, the power supply stage providing a power supply to said amplifier. The difference between the reference signal and a representation of the selected power supply voltage may be amplified. The amplified difference may be summed with the selected supply voltage to form the adjusted supply voltage. The difference between the reference signal and a representation of the adjusted power supply voltage may be RF amplified.

BRIEF DESCRIPTION OF THE DRAWINGS

The present invention is described by way of example with reference to the accompanying Figures, in which.

DETAILED DESCRIPTION OF THE PREFERRED EMBODIMENTS

The invention is described herein by way of particular examples and specifically with reference to a preferred embodiment or embodiments. It will be understood by one skilled in the art that the invention is not limited to the details of the specific embodiments given herein. In particular the invention is described herein by way of reference to a supply architecture for supplying a radio frequency (RF) amplification stage. However more generally the invention may apply to any arrangement where it is necessary to provide a variable voltage level tracking a reference level.

Figure 1:
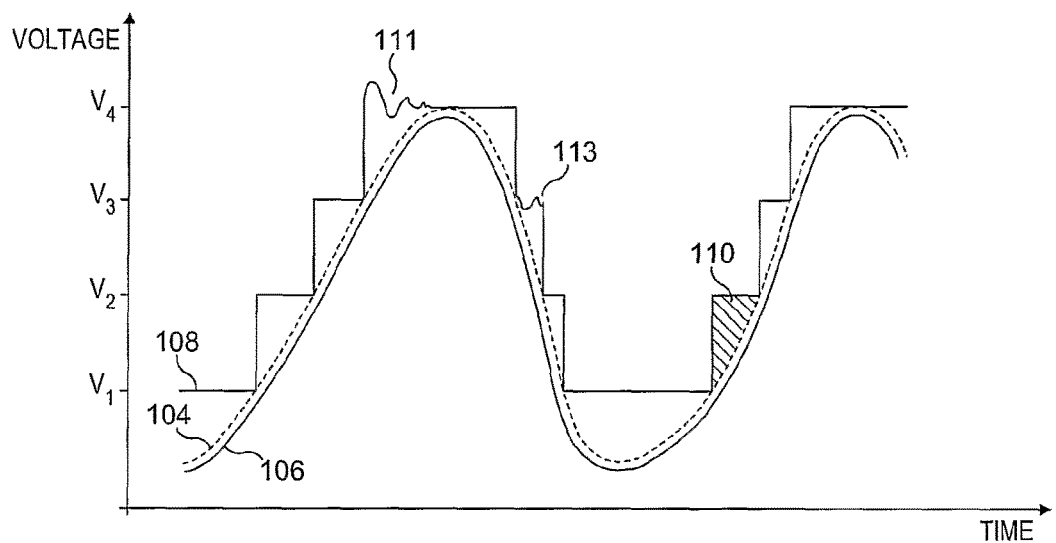
FIG. 1 illustrates an envelope tracking supply voltage variation technique in the prior art.

Reference is first made to FIG. 1, which illustrates the concept of an envelope tracking supply voltage, and the problems associated therewith. The problem is described in relation to a variable voltage supply for a radio frequency (RF) amplifier, the voltage supply being varied to track the RF input signal to be amplified. By way of example, it is assumed that the variable voltage supply is provided by a switchable voltage supply, as known in the art.

Referring to FIG. 1, there is illustrated a plot of voltage against time. On the voltage axis, there is illustrated four specific voltage levels corresponding to the voltage levels provided to a supply voltage selection block. It should be noted that the provision of four voltage supplies is illustrative, and any supply voltage selection block may in fact be provided with more or less voltage supplies in accordance with implementation requirements.

Curve 106 of FIG. 1 illustrates the voltage envelope of an RF input signal to an RF amplification stage. The dash line curve 104 illustrates the idealised voltage supply envelope for such an RF input signal. As can be seen, the dash line curve 104 tracks the RF input signal envelope 106 to provide an idealised power supply voltage level for the input signal voltage level. As such, the idealised power supply voltage level avoids any wasted power and consequently is very efficient.

The stepped trace 108 illustrates a typical actual voltage supply level to an RF power amplifier based on a switched supply voltage of four levels, reflecting performance typical in prior art implementations. As the envelope 106 of the RF input signal reaches ones of the voltage levels $V_1$-$V_4$, the supply voltage is appropriately switched. As can therefore be seen from FIG. 1, the supply voltage 108 steps between the four supply voltage levels, such that it is above the RF input signal at all times. As such, the supply voltage level to the RF amplifier is frequently excessive. The hatched area 110 in FIG. 1, for example, represents wasted energy, corresponding to supply voltage levels above the idealised level, which are consequently unnecessary. As illustrated by the hatched area 110, the stepped supply voltage implementation of the prior art is generally significantly less efficient than the idealised solution.

A further limitation of the architecture of FIG. 1 is illustrated by reference numerals 111 and 113 in FIG. 1. It can be seen, as denoted by reference numerals 111 and 113 that some oscillation may be included in the stepped trace 108. Parasitic inductance and capacitance of the circuit implementation may result in output transients that produce undesirable modulation of the supplied RF amplification stage. As the nature of these transients is broadband and generally unknown they cannot be easily mitigated by techniques that pre-correct the modulation information. This lack of accurate control over the supplied voltage limits the supplies usefulness in RF amplification.

Further problems associated with typical prior art arrangements are discussed in the introductory portion of the specification.

Figure 2:
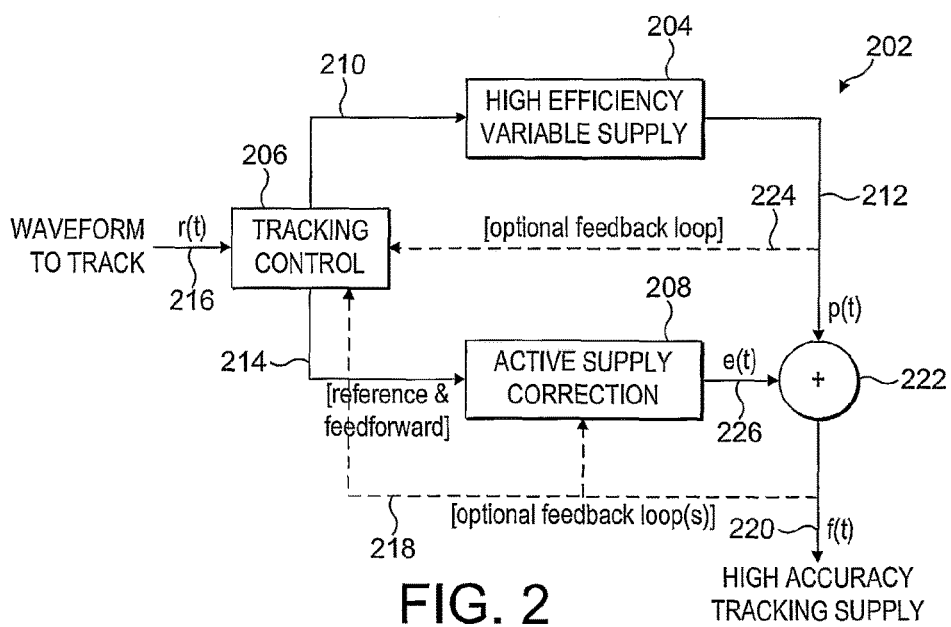
FIG. 2 illustrates a supply architecture in accordance with the principles of the invention.

A preferred supply architecture in accordance with the preferred principles of the invention, which provides an improved performance over the prior art performance illustrated in FIG. 1, is illustrated in FIG. 2. The architecture of FIG. 2 represents an accurate tracking supply, exhibiting high efficiency.

Referring to FIG. 2, the supply architecture is generally designated by reference numeral 202 and includes a tracking control block 206, a high efficiency variable supply block 204, an active supply correction block 208, and a combiner 222.

The tracking control block receives an input on line 216. The tracking control block 206 provides an output on line 210 to an input of the high efficiency variable supply 204, and an output on line 214 to an input of the active supply correction block 208. The high efficiency variable supply block provides an output on line 212 to a first input of the combiner 222. The active supply correction block 208 provides an output on line 226 to a second input of the combiner 222. The combiner generates an output on line 220, which forms an output supply voltage of the supply architecture.

Certain optional connections are also shown in FIG. 2. An optional feedback connection 224 is shown connecting the output of the high efficiency variable supply block 104 on line 212 to an input of the tracking control block 206. An optional feedback connection 218 is shown connecting the output of the combiner on line 220 to the input of the tracking control block 206 and to an input of the active supply correction block 208. Such optional connections are preferably employed to help ensure the resulting supply is a faithful representation of the reference waveform, as discussed with reference to FIG. 5.

It should be noted that the architecture of FIG. 2 is illustrative. Any element thereof may include a plurality of elements or components. Any connections may represent a plurality of connections, such as multiple signal lines, or a single connection, in dependence on a given implementation.

The input on line 216 represents the signal which the supply voltage is to track, and may be the actual signal to be tracked. The signal on line 216 is preferably a radio frequency (RF) envelope waveform, possibly derived from a signal to be amplified by an amplifier to which the supply architecture 202 provides a supply voltage.

The tracking control block 206 may receive on the input line 216 an actual signal to be amplified by an amplifier for which the supply architecture 202 provides a supply voltage. The tracking control block 206 may include an envelope detector, and provide the envelope of the input signal on line 216 on its output line 210, for use by the high efficiency supply block 204. The envelope on line 210 may then be used by the high efficiency supply to determine a voltage level to be applied on line 212. The output line 210 may, in an embodiment, comprise a plurality of lines, representing a plurality of possible switch selections for the high efficiency variable supply block 204, for example where the high efficiency variable supply block is a device for switching between discrete voltage levels.

The tracking control block 206 also provides a reference signal on line 214 to the active supply correction block 208. The reference signal may be the output of an envelope detector, but more generally may be considered to be representative of the signal to which the supply voltage generated by the supply architecture 202 is to track.

The outputs of the tracking control block on lines 210 and 214 may be the same signal, the same signal with different delays, different or modified versions of the same signal, or different signals. The tracking control block is configured to supply to each of the high efficiency variable supply block 204 and the active supply correction block 208 any signal necessary for the operation of such blocks in accordance with the principles of the invention The high efficiency variable supply voltage block 204 is preferably optimised to have high supply efficiency at the expense of tracking accuracy. This trade-off is further discussed herein.

The high efficiency variable supply block 204 provides an intermediate supply voltage level at its output on line 212, which corresponds to what is typically referred to as a coarse or inaccurate tracking of the input signal on line 216. The high efficiency variable supply is preferably of a switching type and may be implemented in any one of a number of ways. For example, there may be provided a number of fixed supply voltage levels which can be switched between, such that the intermediate supply voltage level on line 212 corresponds to one of such fixed supply voltage levels.

In alternative embodiments, the high efficiency variable supply block 204 may include means for combining ones of a plurality of fixed supply voltage levels to generate the intermediate voltage supply level on line 212. The intermediate voltage supply level on line 212 may therefore be based on one or more selected supply voltage levels.

In a further embodiment, the high efficiency variable supply block 204 may be implemented as a poly-phase Class-S stage, for example using a single input supply and multiple tuned combining networks selected either singularly or in combination to achieve a high dynamic range.

The high efficiency variable supply voltage block is not limited to being one of a switching type. Any technique for providing a variable tracking voltage may be used, whether such technique employs switching or otherwise.

In general, therefore, the high efficiency variable supply block 204 may be considered to be a generating means for generating a power supply voltage from a high efficiency variable voltage supply in dependence on a reference signal provided thereto. Such a generating means is effectively a selection means, for selecting a supply voltage in a discrete or continuous manner, i.e. by selection between discrete values or by providing a continuous output which varies.

The active supply correction block 208 operates to provide an error level, or error signal, on line 226, which represents the error between the intermediate supply voltage level on line 212 and an idealised or desired supply voltage level. This error may be represented as an energy level of a voltage level, for example. The idealised supply voltage level is based on the level of the signal on line 216, and represented to the active supply correction block 208 as the reference signal on line 214.

In a practical implementation, in order to generate the error signal the active supply correction block 208 must be able to compare the idealised supply voltage level to a supply voltage level currently being generated. This may be achieved by feedback or feedforward means, in different embodiments. This is discussed in more detail below with reference to FIGS. 4 and 5. Thus the reference signal on line 214 may provide feedforward information as well as the reference signal, or feedback information may be provided via connection 218. Other methods for providing feedback or feedforward prediction may be used.

It should be noted that the idealised supply voltage level may not necessarily be the actual voltage level of the signal on line 216, but may be an offset level from that signal level. Hence the idealised supply voltage level may be considered to be based on or derived from the level of the signal on line 216, and not necessarily be the actual signal level itself.

The combiner 222, which is preferably a low loss combiner, combines the intermediate supply voltage level on line 212 with the error level, which may be a voltage level, on line 226, and generates an output supply voltage level on line 220. The output supply voltage level on line 220 is thus the intermediate supply voltage level, or coarse voltage level, on line 212, with an error presented on line 226 removed therefrom. As the error approximates to the difference between the intermediate voltage level and the idealised supply voltage level, the output supply voltage level more closely approximates to the idealised supply voltage level.

Combining of the supply voltage level on line 212 with the error level on line 226 is preferably not restricted to absolute addition. The error level on line 226 may add, subtract or add and subtract from the supply voltage level on line 212. The active supply correction block 208 may thus be adapted, for example, to source, sink or source and sink energy to allow such correction.

An adjusting means is provided by one or all of the tracking control block 206, the active supply correction block 208, and the combiner 222. The adjusting means receives the power supply generated by the high efficiency variable supply 204, and is adapted to provide an adjusted generated power supply voltage which tracks a reference signal. Such adjusting means is effectively a voltage adjustment block, operated in accordance with the principles of preferred embodiments of the invention to adjust the intermediate supply voltage level on line 212, to provide an adjusted output supply voltage level on line 220.

Figure 3:
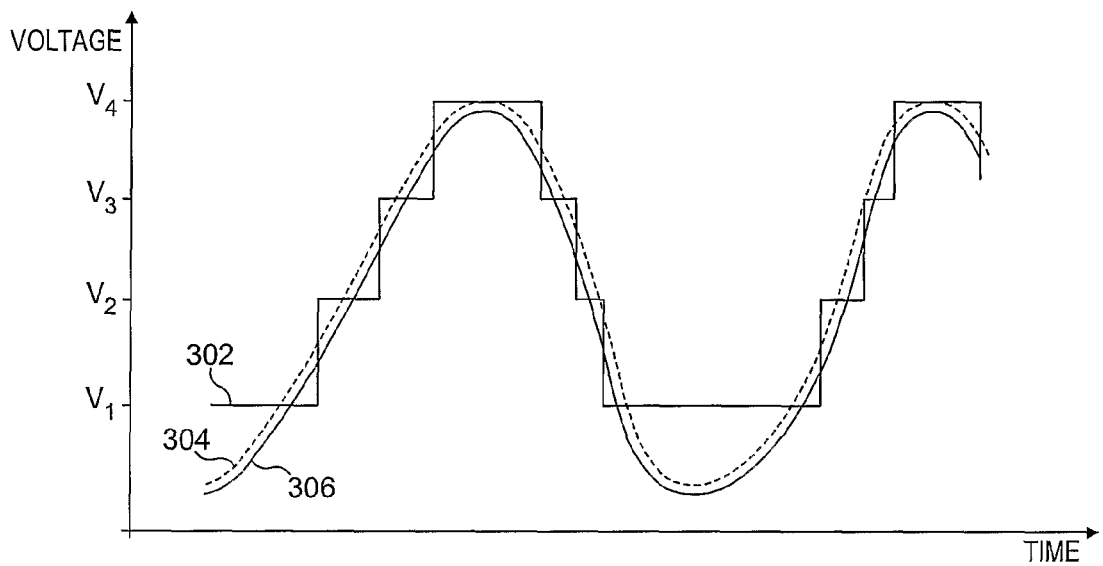
FIG. 3 illustrates the improvement in the envelope tracking supply voltage technique in accordance with the invention.

Referring to FIG. 3, there is illustrated the efficiency improvement achieved in accordance with the invention and its embodiments. The stepped trace 302 illustrates the voltage supply generated by, in an embodiment, the switched supply voltages of the high efficiency variable supply block 204. The supply voltage 302 provided by a supply architecture arranged in accordance with the principles of the invention tracks above and below the envelope 306.

The supply architecture in accordance with the invention is configured to approximately follow, as closely as possible, the envelope of a reference signal without incurring additional energy dissipation, as represented by hatched area 208 in FIG. 1.

The embodiments of the invention result in an actual supply voltage level 302 which more closely follows an idealised supply voltage level 304, resulting in improved efficiency and an intermediate supply voltage level which is more closely aligned to the idealised voltage 304.

The difference between the idealised supply voltage level 304 and the intermediate supply voltage level 302 represents the error signal 226 that is required to be contributed by the active supply correction block. This signal is by preference minimised. The error signal is combined with the intermediate supply voltage level 302 to produce a substantially accurate representation of the idealised supply voltage 304 at the supply output.

The supply architecture of the invention and embodiments thereof, provide a particularly improved solution in which the supply voltage level closely tracks the idealised supply voltage level and, as shown in FIG. 3, minimises wasted energy, and thereby maximises efficiency.

The tracking depicted in FIG. 3 is illustrative. In accordance with the requirements of a given implementation, the intermediate supply level may be adapted to track above the reference signal, above and below the reference signal, or below the reference signal. The appropriate method is chosen in accordance with an optimisation of the supply efficiency as described herein.

The active supply correction block 208, as discussed hereinabove, may be configured to source energy, sink energy, or source and sink energy. To optimise the efficiency of the correction operation, it is preferable that the active supply correction returns at least a portion of any energy sunk to a reservoir (not shown) for future use. The provision of such reservoirs is known in the art.

The invention advantageously provides a high bandwidth, high accuracy variable power supply that exhibits a high power conversion efficiency. Further advantageously, and significantly, the supply provides a large output voltage dynamic range and high peak to average power delivery capability.

Prior art techniques have illustrated the difficultly in achieving a supply with high power conversion efficiency when delivering high bandwidth, dynamic range and accuracy. Architectures have achieved high bandwidth and/or dynamic range at the expense of accuracy, or accuracy at the expense of bandwidth and/or dynamic range, but no solution addresses all three requirements at the same time.

The supply architecture 202 overcomes the accuracy limitations of previous high bandwidth and/or high dynamic range supply architectures by utilising a correction means of lesser constraint. Neither the high efficiency variable supply 204 nor the adjustment means fulfil all the desired constraints individually. However they are arranged, in accordance with embodiments of the invention, such that in combination all of the desired constraints are met.

The optimisation of the supply architecture 202 in accordance with the embodiments of the invention is now described in further detail.

The voltage waveforms at the combiner 222 of FIG. 2 can be represented by the expression:

$$e(t) = r'(t) - p(t) \qquad (1)$$

where e(t) denotes the error voltage level on line 226, p(t) denotes the intermediate supply voltage level on line 212, and r'(t) denotes the output supply voltage level on line 220.

The associated output powers (over a time interval T) can be expressed as follows:

$$E = \int_0^T \frac{e(t) \cdot r'(t)}{T \cdot Z_L(t)} dt \qquad (2)$$

$$E = \int_0^T \frac{p(t) \cdot r'(t)}{T \cdot Z_L(t)} dt \qquad (3)$$

$$E = \int_0^T \frac{r'(t) \cdot r'(t)}{T \cdot Z_L(t)} dt \qquad (4)$$

where E denotes the output power on line 226, P denotes the output power on line 212, R denotes the output power on line 220, and $Z_L(t)$ denotes the load provided by the element connected to line 220. Here the load may be both complex and active, resulting in a component of current independent of the voltage supplied.

The ratio of the output power supplied on line 220 to the powers required to generate the signals on lines 212 and 216 leads to an overall supply efficiency expression of:

$$\xi_{out} = \frac{R}{\left(\frac{P}{\xi_p} + \frac{E}{\xi_e}\right)} \qquad (5)$$

where $\xi_{out}$ denotes the output efficiency at line 220, $\xi_p$ denotes the efficiency generating line 212, and $\xi_e$ denoted the efficiency generating line 226.

It is possible to express the overall efficiency in terms of the relative energy provided by an active correction element (such as element 208) versus the energy provided by the high efficiency variable supply 204, to provide a parameter k, such that k=E/P, as follows:

$$\xi_{out} = \frac{\xi_p \cdot \xi_e \cdot (1+k)}{(k \cdot \xi_p + \xi_p)} \qquad (6)$$

From this expression it is observed that by ensuring k is much less than 1, the resulting supply efficiency is dominated by the high efficiency variable supply block 204. The high efficiency variable supply block 204 being made dominant, allows the efficiency of that supply to dictate the overall efficiency of the supply architecture, and allows the efficiency of the active supply correction block (such as block 208), generating the error or correction signal, to be of less importance.

Figure 4:
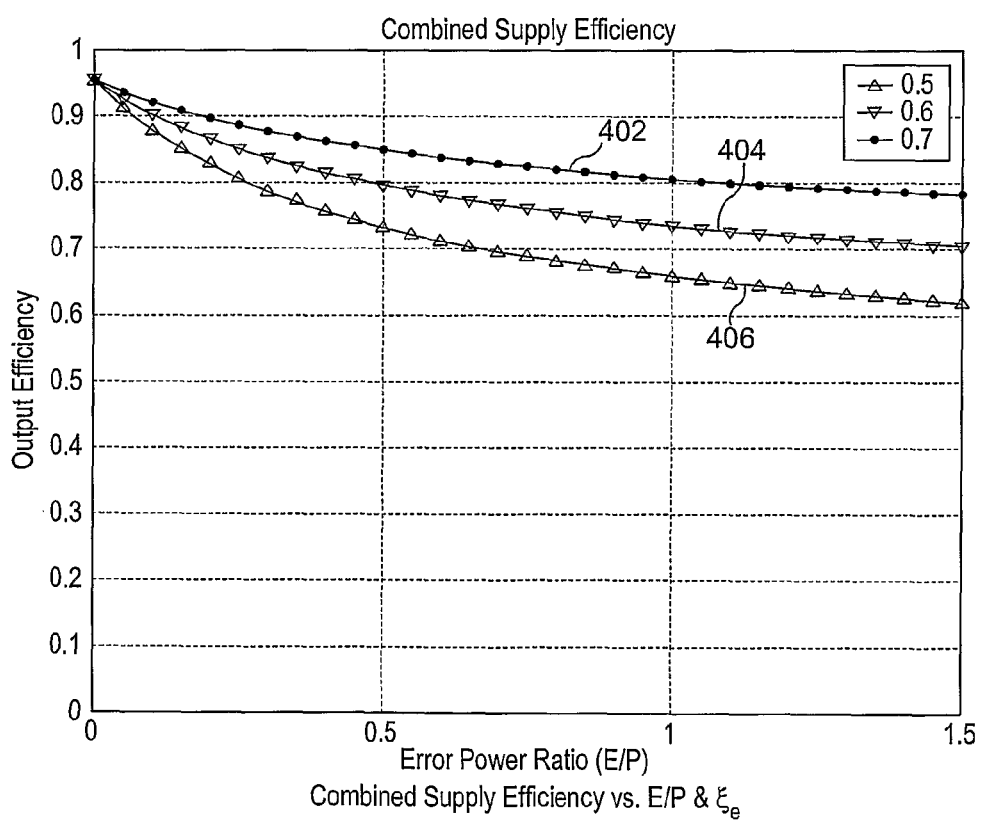
FIG. 4 illustrates efficiency improvements obtained in accordance with the invention.

This relationship is further illustrated in FIG. 4. For a fixed high efficiency supply having an efficiency $\xi_p$, a trade off may be observed between the error power ratio parameter, k, (i.e. the ratio of the error power E to the intermediate power P) and the required efficiency $\xi_e$ of the active correction element 208.

Shown in FIG. 4 are plots of output efficiency ($\xi_{out}$) against error power ratio (k) for three different correction supply efficiencies. Plot 406 represents a correction supply efficiency ($\xi_{out}$) of 0.5; plot 404 represents a correction supply efficiency ($\xi_{out}$) of 0.6; and plot 402 represents a correction supply efficiency ($\xi_{out}$) of 0.7.

In an envelope tracking or envelope elimination and restoration system it is preferable for the resulting supply efficiency, $\xi_{out}$, to be greater than 0.70. This typically corresponds to a supply configuration having parameters in the preferable ranges: $\xi_p$>0.7 (70%), k<0.4 (40%) and $\xi_e$>0.4 (40%). In an embodiment, for k, a still preferred range is k<0.3 (30%).

Hereinabove it is discussed, with reference to equation (6), that by ensuring k is much less than 1 the intermediate supply voltage efficiency dominates the output efficiency. From equation (6) it is also apparent that to generally maximise efficiency it is desirable to maximise both $\xi_p$ and $\xi_e$, while minimising k. Such a simple optimisation of (6) will, however, ignore the effect that maximising $\xi_p$ and minimising k may have on $\xi_e$.

For example, an optimisation method may provide a high efficiency supply 204 and adaptation (correction) arrangement 208 which maximises $\xi_p$ and minimises k at the expense of providing an error signal characteristic having a very high peak to average ratio and slew rate. In the extreme the error signal characteristics may exceed those of the output waveform. Such characteristics may result in a very low $\xi_e$ efficiency and may result in an adjustment/correction means which is impractical to implement, thereby adversely affecting the overall efficiency $_{out}$ It is thus preferable to optimise equation (6) to maximise the output efficiency of the high efficiency variable supply 204, whilst maintaining a joint objective of achieving a low peak-to-average ratio for the error signal characteristics and a low slew rate for the error signal characteristics.

Preferably the high efficiency variable supply has sufficient tracking accuracy to ensure that the ratio of peak error signal to peak output signal is less than 0.7. It is further desirable that the high efficiency variable supply has sufficient tracking accuracy to ensure that the ratio of peak error signal slew rate to peak output signal slew rate is less than 1.5. Such ratios may reflect energy ratios or voltage ratios.

In the absence of distortion the product of maximum slew rate and peak output may be directly related to the maximum bandwidth of the error signal. This optimisation suggests that both the high efficiency variable supply and the correction means preferably have similar output bandwidths that are commensurate with, or moderately exceed, the desired output supply characteristics.

From this analysis it may be determined that the active supply correction block 208 is preferably both substantially linear and achieves a medium level of efficiency with an error level signal having a moderate peak to average characteristic and peak slew rate commensurate with the output signal.

In the preferred implementation, the active supply correction block 208 switches between a plurality of supplies in response to the output required at the output on line 226, with the objective of maximising the efficiency in generating said signal. A preferred implementation of the active supply correction block 208 is as a linear class G amplifier that switches between multiple supplies for efficiency.

In an alternative implementation the input supply to the active supply correction block 208 may be selected by an external element, such as for example the tracking control block 206, based on knowledge of the correction required on line 226 or a prediction of such correction. An example implementation of the active supply correction block 208 in such an arrangement is as a linear class H amplifier that switches between multiple supplies for efficiency.

The scope of efficiency improvement to the active correction element need not be limited to a fixed supply switching Class-G or Class-H operation. Efficiency enhancement through continuous supply modulation techniques, for example, may be provided.

Using a high efficiency supply for coarse tracking in combination with a medium efficiency supply for fine correction, results in a tracking supply of substantial accuracy and efficiency.

A specific implementation of a supply architecture to achieve the inventive effects may be obtained in a number of ways.

Either one or multiple feedback loops be employed in controlling the high efficiency supply and correction elements to ensure that the output supply voltage level ȓ(t) on line 220 is a substantially accurate replica of the tracking input r(t) on line 216. The architecture of these loops may be either joint or independent, and nested or spanning.

Figure 5:
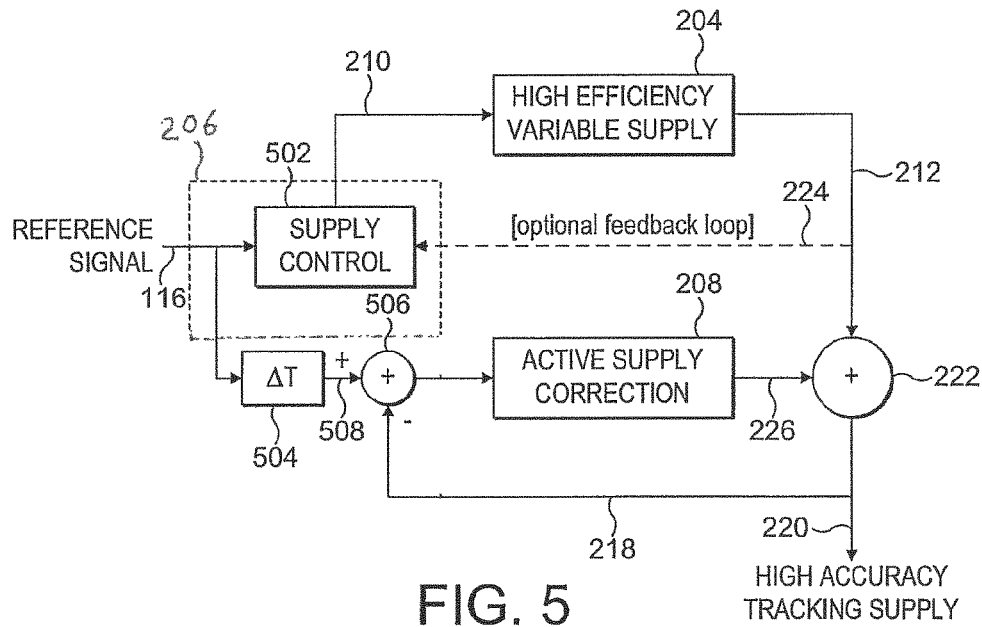
FIG. 5 illustrates a supply architecture in accordance with a first embodiment of the invention.

In an embodiment respective independent tracking loops are employed on the high efficiency supply and the correction elements, with the former detecting the high efficiency supply prior to summing and the latter detecting the final output post-summing. An example of such an implementation is illustrated in FIG. 5. Where elements of FIG. 5 correspond to those shown in FIG. 2, like reference numerals are used.

As shown in FIG. 5, the tracking control block 206 includes a supply control block 502, a delay block 504, and a combiner 506. The input reference signal on line 116 is provided as inputs to the supply control block 502 and the delay block 504. An output of the delay block on line 508 forms a first input to the combiner 506. A second input to the summer 506 is provided by a feedback signal; on line 218 from the output of the combiner 222, being the output supply voltage level. The output of the combiner 506 forms the input to the active supply correction block on line 214.

In operation, the supply control block is adapted to provide the necessary signal to the high efficiency variable supply block 204 to enable correct operation thereof. The supply control block 502 may, for example, be an envelope detector, which provides an envelope waveform on line 210. The supply control block may optionally receive feedback from the output of the high efficiency variable supply block on line 224.

The combiner 506 operates to combine the output supply voltage level on line 220 with the delayed reference signal level, or idealised voltage signal level, on line 508. The output on line 214 then represents the difference between the two, being the error signal. The delay element 504 merely ensures synchronisation of the signals in the architecture.

Figure 6:
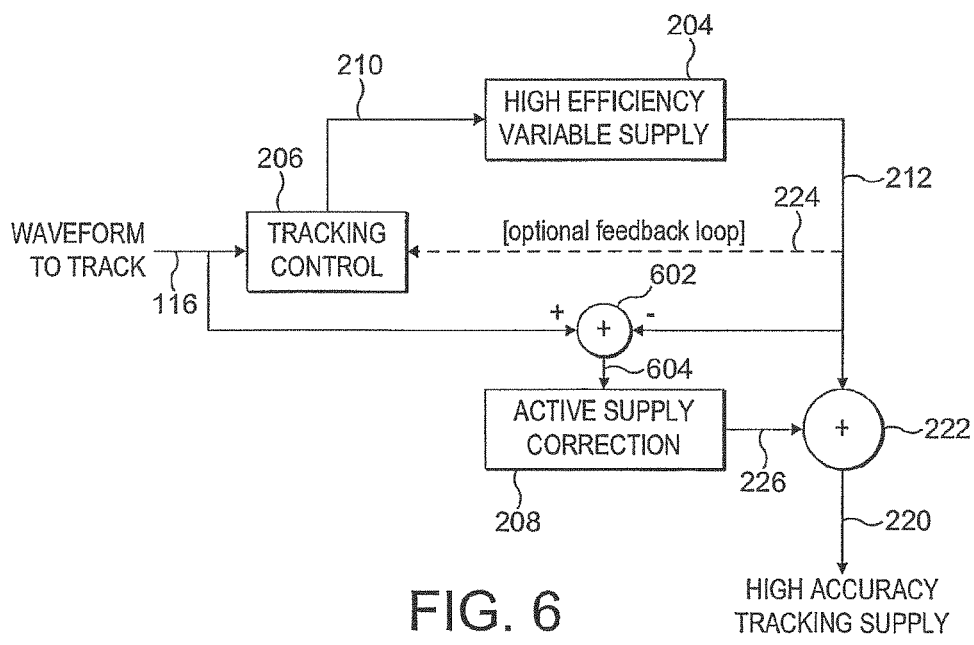
FIG. 6 illustrates a supply architecture in accordance with a first embodiment of the invention.

In another embodiment the feedback loop architecture may be substituted for feedforward, or a combination of both feedback and feed-forward topologies applied. An application of feedforward is illustrated in FIG. 6. Where elements of FIG. 6 correspond to those shown in FIG. 2, like reference numerals are used.

A combiner 602 is provided, having a first input connected to receive the reference input signal on line 116, and a second input connected to receive the intermediate supply voltage level on line 212. The output of the combiner 604 forms an input on line 604 to the active supply correction block.

In this feedforward arrangement, it can be seen that the output of the combiner represents the error in the intermediate supply voltage level and the reference voltage level, which error can be used by the active supply correction block 208 to provide the error signal on line 226.

Where a signal or control path exists, the implementation may include such delay elements as required to balance intrinsic delays within interconnect, component and processing elements. The design and implementation of such will be within the scope of one skilled in the art.

It is further anticipated that the tracking control element may employ prediction to reduce or balance the overall delays between elements of the invention.

The invention has been described herein by way of reference to particular preferred embodiments. However the invention is not limited to such embodiments. The present invention may be advantageously utilised in any environment where variable or switched, selectable voltage supplies are provided, but finds particular utility in the provision of a power supply to a radio frequency amplifier.

What is claimed is:

1. A power supply for generating an output supply voltage, comprising:
   a variable voltage supply configured to generate an intermediate supply voltage based on a reference signal;
   a correction circuit configured to generate an error signal based on the output supply voltage or the intermediate supply voltage; and
   a combiner configured to combine the intermediate supply voltage and the error signal to provide the output supply voltage.

2. The power supply of claim 1, further comprising a tracking control circuit configured to detect an envelope of the reference signal, wherein the variable voltage supply is configured to generate the intermediate supply voltage based on the envelope of the reference signal.

3. The power supply of claim 1, wherein the reference signal comprises a waveform to be amplified by a radio frequency (RF) amplifier, and wherein the output supply voltage provides power to the RF amplifier.

4. The power supply of claim 1, wherein the error signal represents an error between a desired voltage level of the output supply voltage and an actual voltage level of the output supply voltage.

5. The power supply of claim 1, wherein the error signal is generated based on a difference between a voltage level of the reference signal and the output supply voltage.

6. The power supply of claim 1, wherein the error signal is generated based on a prediction of the output supply voltage.

7. The power supply of claim 1, wherein the correction circuit comprises a voltage supply having a lower efficiency than the variable voltage supply.

8. The power supply of claim 1, further comprising a feedback connection from an output of the combiner to the correction circuit.

9. The power supply of claim 1, further comprising:
   a tracking control circuit for providing an input to the variable voltage supply and the correction circuit; and
   a feedback connection from an output of the combiner to the tracking control circuit.

10. The power supply of claim 9, wherein the tracking control circuit receives an input that is representative of a signal to be tracked.

11. The power supply of claim 1, wherein inputs to the variable voltage supply and the correction circuit are representative of a signal to be tracked.

12. The power supply of claim 1, wherein the error signal is generated based on a difference between a voltage level of the reference signal and the intermediate supply voltage.

13. The power supply of claim 1, wherein the variable voltage supply generates the intermediate supply voltage by switching a voltage level to be applied to the combiner from a plurality of discrete voltage levels.

14. The power supply of claim 1, wherein the variable voltage supply and the correction circuit receive the same input signal.

15. The power supply of claim 1, wherein the error signal represents an error between the intermediate supply voltage and a desired voltage level of the output supply voltage.

16. A method of generating an output supply voltage, comprising:
   generating an intermediate supply voltage based on a reference signal;
   generating an error signal based on a voltage level of the output supply voltage or the intermediate supply voltage; and
   combining the error signal and the intermediate supply voltage to provide the output supply voltage.

17. The method of claim 16, further comprising detecting an envelope of the reference signal, wherein generating the intermediate supply voltage is based on the envelope of the reference signal.

18. The method of claim 16, wherein the error signal represents an error between a desired voltage level of the output supply voltage and an actual voltage level of the output supply voltage.

19. The method of claim 16, wherein the error signal is generated based on a difference between a voltage level of the reference signal and the intermediate supply voltage.

20. The method of claim 16, wherein the error signal is generated based on a difference between a voltage level of the reference signal and the output supply voltage.

21. The method of claim 16, wherein generating the intermediate supply voltage comprises switching a voltage level from a plurality of discrete voltage levels.

22. An apparatus for generating an output supply voltage, comprising:
   means for generating an intermediate supply voltage based on a reference signal;
   means for generating an error signal based on a voltage level of the output supply voltage or the intermediate supply voltage; and
   means for combining the error signal and the intermediate supply voltage to provide the output supply voltage.

23. An apparatus comprising:
   an amplifier configured to amplify an input signal;
   a variable voltage supply configured to generate an intermediate supply voltage based on the input signal;
   a correction circuit configured to generate an error signal based on an output supply voltage or the intermediate supply voltage; and
   a combiner configured to combine the intermediate supply voltage and the error signal to provide the output supply voltage, wherein the output supply voltage provides power to the amplifier.

* * * * *